United States Patent
Huang et al.

(10) Patent No.: US 9,588,429 B1
(45) Date of Patent: Mar. 7, 2017

(54) LITHOGRAPHIC DEVELOPER COMPOSITION AND METHOD OF USE

(71) Applicant: Eastman Kodak Company, Rochester, NY (US)

(72) Inventors: Jianbing Huang, Trumbull, CT (US); Gerhard Hauck, Badenhausen (DE); Celin Savariar-Hauck, Badenhausen (DE); Andrea Pauls, Osterode (DE); Dietmar Frank, Osterode (DE); Oliver Piestert, Schwetzingen (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/844,063

(22) Filed: Sep. 3, 2015

(51) Int. Cl.
| | |
|---|---|
| G03F 7/00 | (2006.01) |
| G03F 7/32 | (2006.01) |
| G03F 7/20 | (2006.01) |
| G03F 7/40 | (2006.01) |
| B41C 1/10 | (2006.01) |

(52) U.S. Cl.
CPC .......... G03F 7/327 (2013.01); B41C 1/1041 (2013.01); G03F 7/20 (2013.01); G03F 7/40 (2013.01)

(58) Field of Classification Search
CPC ..................................................... G03F 7/322
See application file for complete search history.

(56) References Cited

U.S. PATENT DOCUMENTS

| | | | |
|---|---|---|---|
| 2,802,845 A | 8/1957 | Sadler | |
| 7,018,777 B2 | 3/2006 | Ohnishi | |
| 7,081,330 B2 | 7/2006 | Takamiya | |
| 8,088,549 B2 | 1/2012 | Levanon et al. | |
| 8,530,143 B2 | 9/2013 | Levanon et al. | |
| 8,936,899 B2 | 1/2015 | Hauck et al. | |
| 2006/0154187 A1* | 7/2006 | Wilson | G03F 7/322 430/331 |
| 2012/0270152 A1 | 10/2012 | Hauck et al. | |
| 2014/0065539 A1* | 3/2014 | Hauck | G03F 7/0045 430/278.1 |
| 2015/0241777 A1 | 8/2015 | Savariar-Hauck et al. | |

\* cited by examiner

*Primary Examiner* — Chanceity Robinson
(74) *Attorney, Agent, or Firm* — J. Lanny Tucker

(57) ABSTRACT

Lithographic printing plates are formed by imagewise exposing a single-layer or dual-layer positive-working lithographic printing plate precursor. The precursor has an outermost ink receptive layer containing a phenolic resin. The exposed precursor can be processed using a silicate-free developer composition having a pH of at least 12.5. This composition also includes an alkali metal hydroxide; a coating protecting agent that is a quaternary ammonium salt or phosphonium salt, or a mixture thereof, and a moderator for the coating protecting agent that is represented by the following general formula (I):

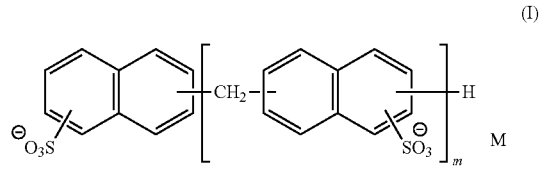

wherein m is at an integer of at least 1 and up to and including 10 and M represents one or more counterions sufficient to balance the negatively-charged sulfonate groups.

14 Claims, No Drawings

LITHOGRAPHIC DEVELOPER COMPOSITION AND METHOD OF USE

FIELD OF THE INVENTION

This invention relates to a unique silicate-free developer compositions that have relatively high pH that can be used in a method for providing lithographic printing plates from corresponding infrared radiation sensitive-exposed single-layer or dual-layer positive-working lithographic printing plate precursors.

BACKGROUND OF THE INVENTION

In conventional or "wet" lithographic printing, ink receptive regions, known as image areas, are generated on a hydrophilic surface. When the surface is moistened with water and ink is applied, the hydrophilic surface not covered by the image areas (known as hydrophilic regions or non-image areas) retain the water and repel the ink, and the ink receptive regions accept the ink and repel the water. The ink can be directly transferred to the surface of a material upon which the image is to be reproduced. Alternatively, the ink can be first transferred to an intermediate blanket that in turn is used to transfer the ink to the surface of the material upon which the image is to be reproduced.

Imageable elements (lithographic printing plate precursors) useful to prepare lithographic printing plates typically comprise one or more imageable layers applied over the hydrophilic surface of a substrate. The imageable layers include one or more radiation-sensitive components that can be dispersed in a suitable binder or act as the binder itself. After the imageable elements are imagewise exposed to suitable radiation to form exposed and non-exposed regions, either the exposed regions or the non-exposed regions of the imageable layer are removed by a suitable developer, revealing the underlying hydrophilic surface of the substrate. If the exposed regions are removed, the imageable element is considered as positive-working. Conversely, if the non-exposed regions are removed, the imageable element is considered as negative-working. In each instance, the regions of the imageable layer (that are not removed by a developer) that remain are ink-receptive, and the regions of the hydrophilic surface revealed by the developing process accept water and aqueous solutions, typically a fountain solution, and repel ink.

Direct digital or thermal imaging has become increasingly important in the printing industry because of their stability to ambient light. The lithographic printing plate precursors used for the preparation of lithographic printing plates have been designed to be sensitive to heat or infrared radiation and can be exposed using thermal heads or more usually, infrared laser diodes that image in response to signals from a digital copy of the image in a computer a platesetter. This "computer-to-plate" technology has generally replaced the former technology where masking films were used to expose the elements.

As noted, the noted imaging techniques often require the use of water or a developer (neutral to alkaline pH) as a processing solution to remove exposed (positive-working) or non-exposed (negative-working) regions of the imageable layer(s). In general, the processing solution is specifically designed for the specific radiation-sensitive chemistry in the exposed precursor and to provide processing as cleanly as possible.

It is well known that an imageable layer coating in positive-working, infrared radiation-sensitive lithographic printing plate precursor has a much smaller difference in developer solubility between non-exposed regions and exposed regions than known imageable layer coatings used in positive-working, UV-sensitive lithographic printing plate precursors.

A considerable advance in the art for processing exposed positive-working lithographic printing plate precursors is described in U.S. Pat. No. 8,530,143 (Levanon et al.) in which silicate-free developers are described to provide a number of processing improvements. Such advance in the lithographic art is provided for both single or dual imageable layer positive-working lithographic printing plate precursors as described in U.S. Pat. No. 8,088,549 (Levanon et al.) and U.S. Pat. No. 8,936,899 (Hauck et al.), and U.S. Patent Application Publication 2012/0270152 (Hauck et al.).

Therefore, it has been proposed in the industry to protect the imageable layer coating in the non-exposed regions by incorporating a coating protecting agent, such as quaternary ammonium and phosphonium salts, into a developer composition that is used for processing after imagewise exposing the infrared radiation-sensitive lithographic printing plate precursors, for example using quaternary ammonium halides as described for example, in U.S. Pat. No. 7,081,330 (Takamiya) and in copending and commonly assigned U.S. Ser. No. 14/189,055 (filed Feb. 25, 2014 by Savariar-Hauck, Hauck, Balbinot, and Pauls). While such coating protecting agents are effective for this purpose, if there is too much of such compounds, the development speed can be reduced in the non-exposed regions. Therefore, the concentration of the coating protecting agent must be carefully optimized in the developer composition for maximizing the necessary solubility differential.

While studying this problem, it was discovered that the optimal amount of the coating protecting agent increases as a developer composition becomes seasoned (loaded with dissolved coating materials from the exposed precursors). This upward shift will reduce the effectiveness of the actual protecting agent in the developer composition (thus, it drops below the optimal level) and the developer composition becomes more aggressive in removing the imageable layer coating in the non-exposed regions.

Thus, there is a need for a developer composition that is less sensitive to the increase in dissolved coating materials as a processing cycle continues, for example, by finding a way to maintain the effectiveness of a coating protecting agent in protecting the imageable coating in the non-exposed regions during such seasoning, while maintaining development speed in the exposed regions. For practical purposes, such developer composition needs to be stable at room temperature and have a clear appearance.

SUMMARY OF THE INVENTION

The present invention is directed to the noted problems with a silicate-free developer composition having a pH of at least 12.5, and comprising:

an alkali metal hydroxide present in an amount sufficient to provide the pH of at least 12.5;

a coating protecting agent, and a moderator for the coating protecting agent that is represented by the following general formula (I):

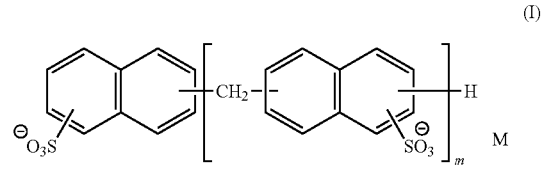

wherein m is at an integer of at least 1 and up to and including 10, and M represents one or more counterions sufficient to balance the negatively-charged sulfonate groups, and wherein the coating protecting agent is a quaternary ammonium salt or a phosphonium salt represented by the following formulae (Q) and (P), respectively, or a mixture thereof:

$$N(R_1R_2R_3R_4)^+X^- \quad (Q)$$

wherein $R_1$, $R_2$, $R_3$, and $R_4$ are independently hydrocarbon groups connected directly to the nitrogen atom, each hydrocarbon group comprising sufficient carbon atoms so that the total number of carbon atoms for the four $R_1$, $R_2$, $R_3$, and $R_4$ hydrocarbon groups is at least 15 and up to and including 30, the maximum number of carbon atoms in each one of $R_1$, $R_2$, $R_3$, and $R_4$ is at least 5 and up to and including 22, and optionally, two or more of the $R_1$, $R_2$, $R_3$, and $R_4$ hydrocarbon groups can be connected to each other to form one or more heterocyclic ring structures with the illustrated nitrogen atom;

$$P(R_5R_6R_7R_8)^+X^- \quad (P)$$

wherein $R_5$, $R_6$, $R_7$, and $R_8$ are independently hydrocarbon groups connected directly to the phosphorus atom, each hydrocarbon group comprising sufficient carbon atoms so that the total number of carbon atoms for the four $R_5$, $R_6$, $R_7$, and $R_8$ hydrocarbon groups is at least 15 and up to and including 30, the maximum number of carbon atoms in each one of $R_5$, $R_6$, $R_7$, and $R_8$ is at least 5 and up to and including 22, and optionally, two or more of the $R_5$, $R_6$, $R_7$, and $R_8$ hydrocarbon groups can be connected to each other to form one or more heterocyclic ring structures with the illustrated phosphorus atom; and $X^-$ is an anion.

This invention also provides a method for forming a lithographic printing plate, the method comprising:

imagewise exposing a positive-working lithographic printing plate precursor with infrared radiation to form an exposed precursor comprising exposed regions and non-exposed regions, and processing the exposed precursor to remove the exposed regions using the silicate-free developer composition of any embodiment of this invention to provide a lithographic printing plate, wherein the positive-working lithographic printing plate precursor comprises:

a grained and anodized aluminum-containing substrate, an outermost ink receptive layer disposed over the grained and anodized aluminum-containing substrate, the outermost ink receptive layer comprising at least one water-insoluble, alkali solution-soluble or -dispersible outermost resin that is a phenolic resin, and optionally, an innermost ink receptive layer that is disposed between the grained and anodized aluminum-containing substrate and the outermost ink receptive layer, the innermost ink receptive layer comprising at least one water-insoluble, alkali solution-soluble or -dispersible innermost resin that is different from the water-insoluble, alkali solution-soluble or -dispersible outermost resin, the positive-working lithographic printing plate precursor further comprising an infrared radiation absorber.

The present invention provides a silicate-free developer composition that can be used to process infrared radiation exposed positive-working lithographic printing plate precursors where the resistance of the non-exposed outermost ink receptive layer against such a silicate-free developer composition is not diminished even as the silicate-free developer composition becomes seasoned with dissolved ink receptive layer coating materials. The improvement is achieved by including a compound called a "moderator" in the silicate-free developer composition, which compound allows the use of relatively high amount of strong coating protecting agent (quaternary ammonium salt or phosphonium salt) that would hamper clean removal of the ink receptive layer composition in the infrared radiation-exposed areas in the absence of such a moderator. Thus, the combination of a moderator according to formula (I) and sufficient amount of a strong coating protecting agent in a silicate-free developer composition according to the present invention allows consistent removal of the ink receptive layer(s) of a lithographic printing plate precursor in the infrared radiation exposed regions without damaging the ink receptive layer(s) in the non-exposed areas.

DETAILED DESCRIPTION OF THE INVENTION

The following discussion is directed to various embodiments of the present invention and while some embodiments can be particularly useful, the disclosed embodiments should not be interpreted or otherwise considered to limit the scope of the present invention, as claimed below. In addition, one skilled in the art will understand that the following disclosure has broader application than is explicitly described and that the discussion of any specific embodiment is not intended to limit the scope of the present invention.

DEFINITIONS

As used herein to define various components of the various ink receptive layers (and coating formulations) and silicate-free developer compositions, unless otherwise indicated, the singular forms "a," "an," and "the" are intended to include one or more of the components (that is, including a plurality of referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "lithographic printing plate precursor," "positive-working lithographic printing plate precursor," and "precursor" can be used interchangeably and are meant to be references to embodiments used in the present invention.

The term "support" is used herein to refer to an aluminum-containing material (web, sheet, foil, or other form) that is then treated to prepare a "substrate" that refers to the hydrophilic article upon which one or more ink receptive layers are disposed.

The term "post-treatment" refers to contacting the grained and anodized aluminum-containing support with an aqueous solution at an appropriate temperature for a period of time, followed by rinsing and drying, before any ink receptive layer formulations are applied.

Some embodiments of the present invention are used with "single-layer" positive-working lithographic printing plate precursors and thus have a single ink receptive layer that is the outermost ink receptive layer since there are no layers purposely disposed on top of it.

Other embodiments of the present invention are used with what are considered "double-layer precursors" having two ink receptive layers identified as an innermost ink receptive layer nearest the substrate and an outermost ink receptive layer that is disposed over the innermost ink receptive layer. Generally, the outermost ink receptive layer is the outermost layer of the precursor. In some literature, the innermost ink receptive layer is known as the "inner" or inside imageable layer, and the outermost ink receptive layer is known as the "outer" or outside imageable layer.

The term "ink receptive", as applied to the imageable layers in the precursors, refers to the property in which the imageable layer, after imagewise exposure and development, lithographic ink is attracted.

Unless otherwise indicated, percentages refer to percent by dry weight of a composition or layer, or % solids of a solution or formulation.

As used herein, the term "infrared" refers to radiation having a wavelength of at least 700 nm and higher. In most instances, the term "infrared" is used to include the "near-infrared" region of the electromagnetic spectrum that is defined herein to be at least 700 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

Unless otherwise indicated, the terms "polymer" and "polymeric" refer to high and low molecular weight polymers including oligomers and includes homopolymers and copolymers.

The term "copolymer" refers to polymers comprising recurring units that are derived from two or more different monomers, in random order along the polymer backbone. That is, the copolymers comprise at least two types of recurring units having different chemical structures.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

As used herein with reference to the processing solutions, the term "silicate" is meant to include both silicate and metasilicate compounds.

Positive-Working Lithographic Printing Plate Precursors

The positive-working lithographic printing plate precursors that can be used in the practice of the method of the present invention can be composed of the following layer structures and materials.

Grained and Anodized Aluminum-Containing Substrate:

In general, the lithographic printing plate precursors are formed by suitable application of one or two ink receptive layer formulations to a suitable aluminum-containing substrate to form one or two ink receptive layers. This aluminum-containing substrate is usually treated or coated in various ways as described below prior to application of the ink receptive layer formulation(s). For example, the aluminum-containing substrate can be treated to provide an "interlayer" for improved adhesion or hydrophilicity, and the optional innermost ink receptive layer and outermost ink receptive layer can be applied over the interlayer.

The aluminum-containing substrate generally has a hydrophilic surface, or a surface that is more hydrophilic than the applied innermost and outermost ink receptive layer formulations. The aluminum-containing substrate comprises an aluminum support that is treated using mechanical graining, electrochemical graining or chemical graining to form a desired rough surface, followed by anodizing using a suitable acid to provide the desired anodic oxide surface and a desired oxide pore diameter. The aluminum sheet is mechanically or electrochemically grained and anodized using phosphoric acid or sulfuric acid and conventional procedures.

For example, an electrochemically grained aluminum support can be anodized in a direct current passing through a sulfuric acid solution (5-30 weight %) at a temperature of at least 10° C. and up to and including 60° C. for at least 5 seconds and up to and including 250 seconds to form an oxide layer on the metal surface. Generally, sulfuric acid anodization is carried out to provide an aluminum oxide layer of at least 0.3 $g/m^2$ and typically at least 1 $g/m^2$ and up to and including 10 $g/m^2$.

The sulfuric acid formed aluminum oxide layer generally has fine concave parts that are sometimes referred as "micropores" or "pores" that are distributed, perhaps uniformly, over the layer surface. The density (or vacancy) is generally controlled by properly selecting the conditions of the sulfuric acid anodization treatment. The pores can appear as columns within the aluminum oxide layer, as viewed in a cross-sectional micro-image.

An interlayer can be formed or disposed directly on the grained and anodized aluminum-containing substrate by treatment of the grained and anodized aluminum-containing support with an aqueous solution (hereafter referred as a PAT solution), followed by rinsing and drying. A particularly useful PAT solution comprises a homopolymer of vinyl phosphonic acid, poly(vinyl phosphonic acid) (PVPA), or a copolymer of vinyl phosphonic acid. A more desirable PAT solution further comprises phosphoric acid or a salt thereof comprising aluminum cations. A typical PAT solution can be prepared by dissolving poly(vinyl phosphonic acid) in water in an amount of at least 0.05 weight % and up to and including 20 weight % and phosphoric acid in an amount from 0 and up to and including 10 weight %.

The thickness of the grained and anodized aluminum-containing substrate (with interlayer) can be varied but should be sufficient to sustain the wear from printing and thin enough to wrap around a printing form.

The backside (non-image bearing side) of the grained and anodized aluminum-containing substrate can be coated with a non-radiation-sensitive slipping or matte layer.

The grained and anodized aluminum-containing substrate can also be in a cylindrical form having the poly(vinyl phosphonic acid) interlayer and ink receptive layer(s) disposed thereon, and thus be an integral part of the printing press as described for example in U.S. Pat. No. 5,713,287 (Gelbart).

Innermost Ink Receptive Layer:

An innermost ink receptive layer is optional, but in those embodiments in which it is present, it is disposed over the grained and anodized aluminum-containing substrate described above (with or without the described interlayer). In such embodiments, the innermost ink receptive layer is disposed directly on the substrate described above (with appropriate interlayer), meaning that there are no intervening layers between them.

The innermost ink receptive layer can comprise at least one water-insoluble, alkali solution-soluble or -dispersible "innermost resin" (polymeric binder) that is different from the at least one water-insoluble, alkali solution-soluble or -dispersible outermost resin (described below). Desirably, this innermost resin is resistant to harsh press chemicals that contain strong organic solvents such as glycol ethers and diacetone alcohol. More particularly, the innermost resin can participate in crosslinking reactions during high temperature baking of the precursor after imagewise exposure and processing.

Useful innermost resins for the innermost ink receptive layer include polymer binders comprising recurring units derived from one or more N-alkoxymethyl (alkyl)acrylamides or alkoxymethyl (alkyl)acrylates as described for example in U.S. Patent Application Publication 2011/0097666 (Savariar-Hauck et al.) and U.S. Pat. No. 8,530,141 (Savariar-Hauck et al.), the disclosures of both of which are incorporated herein by reference for details of such polymers including those defined by Structure (II) in the noted publications. Of these materials, the N-alkoxymethyl (meth) acrylamides are particularly useful and can comprise up to and including 80 weight % of the total recurring units in the innermost resin. Examples of useful ethylenically unsaturated polymerizable monomers include but are not limited to, N-methoxymethyl methacrylamide, N-isopropoxymethyl methacrylamide, N-n-butoxymethyl methacrylamide, N-isobutoxymethacrylamide, N-t-butoxymethacrylamide, N-ethylhexoxymethacrylamide, N-ethoxymethyl acrylamide, and N-cyclohexyloxymethyl methacrylamide. Useful alkoxymethyl (meth)acrylates include but are not limited to, isopropoxymethyl methacrylate, phenoxymethyl methacrylate, methoxymethyl acrylate, phenoxymethyl acrylate, and ethoxymethyl acrylate.

Other useful innermost resins in the first ink receptive layer include those described in U.S. Pat. No. 7,858,292 (Bauman et al.) that comprise recurring units comprising pendant 1H-tetrazole groups, the disclosure of which is incorporated herein by reference for the details of such polymeric binders.

Mixtures of one or more innermost resins comprising recurring units derived from N-alkoxymethyl (alkyl)acrylamides with one or more polymeric binders comprising recurring units comprising pendant tetrazole groups can be used if desired. Alternatively, the polymeric binders can comprise recurring units derived from N-alkoxymethyl (alkyl)acrylamides and recurring units comprising pendant tetrazole groups. In such polymeric binders, the recurring units derived from the N-alkoxymethyl (alkyl)acrylamides can be present in an amount of at least 2 weight % and up to and including 80 weight %, and the recurring units comprising pendant tetrazole groups can be present in an amount of at least 5 weight % and up to and including 80 weight %. Such polymeric binders can also comprise recurring units having pendant cyano groups (for example, at least 10 weight %) and other recurring units having pendant carboxy, phospho, or sulfo groups, or recurring units derived from Structures D1 through D5 of U.S. Patent Application Publication 2009/0042135 (Patel et al.) the disclosure of which is incorporated herein by reference for these recurring units.

Still other useful water-insoluble, alkali solution-soluble or -dispersible innermost resins are polymers each of which comprises recurring units derived from a styrene (styrene or a derivative thereof) and an alkyl (meth)acrylate, (meth) acrylamide, N-phenyl maleimide, (meth)acrylic acid, and other ethylenically unsaturated polymerizable monomers.

For example, the innermost resin can be a polymer comprising recurring units derived from one or more of a styrene, an alkyl (meth)acrylate, (meth)acrylic acid, (meth) acrylamide, (meth)acrylonitrile, N-phenyl maleimide, N-alkoxymethyl (meth)acrylamide, and 5-methacrylamido tetrazole.

In general, each innermost resin can have an acid value of at least 30 mg KOH/g of polymeric binder or an acid value of at least 40 mg KOH/g of polymeric binder and up to and including 150 mg KOH/g of polymeric binder. Acid value can be determined using known methods. The innermost resin typically has a weight average molecular weight in the range of at least 10,000 and up to and including 1,000,000, or of at least 100,000 and up to and including 400,000.

In the lithographic printing plate precursors used in the present invention, the one or more innermost resins are present in the innermost ink receptive layer an amount of at least 10 weight % and typically of at least 20 weight % and up to and including 100 weight % of innermost ink receptive layer total dry weight.

The innermost ink receptive layer can additionally comprise one or more surfactants, dispersing aids, humectants, biocides, viscosity builders, drying agents, defoamers, preservatives, antioxidants, colorants, or organic or inorganic particles, all in known amounts. Some particular useful colorants suitable for the innermost ink receptive layer are described for example in U.S. Pat. No. 8,936,899 (Hauck et al.) the disclosure of which is incorporate herein by reference.

The innermost ink receptive layer can be formed by applying an innermost ink receptive layer formulation to the interlayer of the grained and anodized aluminum-containing substrate using conventional coating or lamination methods. Thus, this formulation can be applied by dispersing or dissolving the desired ingredients (one or more innermost resins and infrared radiation absorber, described below, if present) in a suitable coating solvent, and the resulting formulation is applied to the interlayer of the grained and anodized aluminum-containing substrate using suitable equipment and procedures, such as spin coating, knife coating, gravure coating, die coating, slot coating, bar coating, wire rod coating, roller coating, extrusion hopper coating, or by spraying it.

The dry coating weight for the innermost ink receptive layer can be at least 0.5 g/m$^2$ and up to and including 2.5 g/m$^2$ and typically at least 0.6 g/m$^2$ and up to and including 2 g/m$^2$.

The selection of solvents used to coat the innermost ink receptive layer formulation depends upon the nature of the resins and other components in the formulations, and can include acetone, methyl ethyl ketone, or another ketone, tetrahydrofuran, 1-methoxypropan-2-ol, 1-methoxy-2-propyl acetate, and mixtures thereof using conditions and techniques well known in the art. The applied innermost ink receptive layer formulation can be dried in a suitable manner.

Outermost Ink Receptive Layer:

The outermost ink receptive layer is disposed over the grained and anodized aluminum-containing substrate, and or over the innermost ink receptive layer when it is present. There can be an intermediate layer between the innermost ink receptive layer and outermost second ink receptive layer, but in most embodiments, there are no intermediate layers and the outermost ink receptive layer is disposed directly on the innermost ink receptive layer. In all embodiments, the outermost ink receptive layer serves as the outermost layer of the positive-working lithographic printing plate precursors.

Before imagewise exposure to infrared radiation, the outermost ink receptive layer is generally not soluble or removable by an alkaline processing solution (developer) within the usual time allocated for development, but after imagewise exposure, the exposed regions of the outermost ink receptive become soluble in or removable by the silicate-free developer composition.

The outermost ink receptive layer can be composed like the ink receptive layers described for example, in U.S. Pat. No. 6,255,033 (Levanon et al.), U.S. Pat. No. 6,280,899 (et al.), U.S. Pat. No. 6,391,524 (Yates et al.), U.S. Pat. No. 6,485,890 (Hoare et al.), U.S. Pat. No. 6,558,869 (Hearson et al.), U.S. Pat. No. 6,706,466 (Parsons et al.), U.S. Pat. No. 6,541,181 (Levanon et al.), U.S. Pat. No. 7,223,506 (Kitson et al.), U.S. Pat. No. 7,247,418 (Saraiya et al.), U.S. Pat. No. 7,270,930 (Hauck et al.), U.S. Pat. No. 7,279,263 (Goodin), and U.S. Pat. No. 7,399,576 (Levanon), and U.S. Published Patent Applications 2006/0130689 (Timpe et al.), 2005/0214677 (Nagashima), 2004/0013965 (Memetea et al.), 2005/0003296 (Memetea et al.), and 2005/0214678 (Nagashima), the disclosures of all of which are incorporated herein by reference.

The outermost ink receptive layer generally comprises one or more water-insoluble, alkali solution-soluble or -dispersible "outermost resins" (polymeric binders) that are generally different from the water-insoluble, alkali solution-soluble or -dispersible innermost resins described above.

The outermost ink receptive layer typically contains at least one phenolic resin (phenolic polymeric binder) as an outermost resin that is generally water-insoluble but soluble in the silicate-free developer compositions defined below. The term "phenolic" refers to a hydroxyl-substituted aryl group.

Useful phenolic polymers include but are not limited to, homopolymers and copolymers derived from vinyl phenol. Other useful additional phenolic polymers include but are not limited to, novolak resins, resole resins, poly(vinyl acetals) having pendant phenolic groups, and mixtures of any of these resins (such as mixtures of one or more novolak resins and one or more resole resins). Generally, such second resins have a number average molecular weight of at least 3,000 and up to and including 200,000, and or of at least 6,000 and up to and including 100,000, as determined using conventional procedures. Typical novolak resins include but are not limited to, phenol-formaldehyde resins, cresol-formaldehyde resins, phenol-cresol-formaldehyde resins, p-t-butylphenol-formaldehyde resins, and pyrogallol-acetone resins, such as novolak resins prepared from reacting m-cresol or an m,p-cresol mixture with formaldehyde using conventional conditions.

Some particularly useful outermost resins are phenolic polyvinyl acetal resins comprising recurring units having an acetal structure, for example like those described in at least the following publications: U.S. Pat. No. 7,399,576 (Levanon et al.), U.S. Pat. No. 8,298,750 (Levanon et al.), and U.S. Pat. No. 7,544,462 (Levanon et al.), and U.S. Patent Application Publications 2006/0154187 (Wilson et al.) and 2009/0162783 (Levanon et al.) the disclosures of which are incorporated herein by reference.

Still other useful polyvinyl acetal resins can comprise, in random fashion: a) vinyl acetal recurring units comprising pendant hydroxyaryl groups, b) recurring units comprising hydroxyaryl ester groups, or c) either or both types of recurring units (Ia) and (Ib), in random fashion. Such outermost resins can comprise recurring units represented by either or both of the following Structures (Ia) and (Ib), in random fashion:

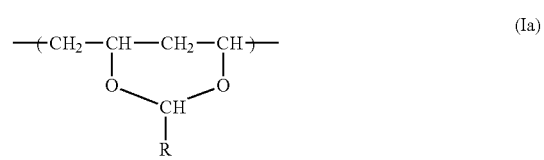

(Ia)

(Ib)

that are described in more detail below.

Still other embodiments include the use of an outermost resin that comprises, in random fashion, in addition to the recurring units from Structures (Ia) and (Ib), at least 25 and up to and including 60 mol % of recurring units represented by the following Structure (Ic):

(Ic)

and optionally up to 25 mol % of recurring units represented by the following Structure (Id), optionally up to 10 mol % of recurring units represented by the following Structure (Ie), and optionally up to 20 mol % of recurring units represented by the following Structure (If), in random fashion, all based on the total recurring units in the polymeric binder:

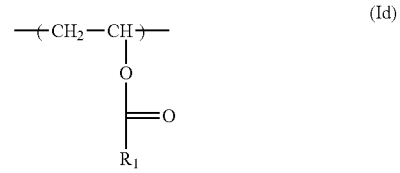

(Id)

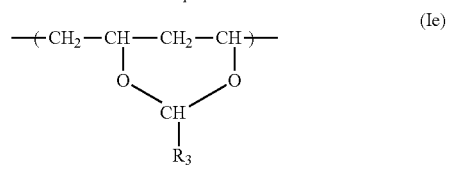

(Ie)

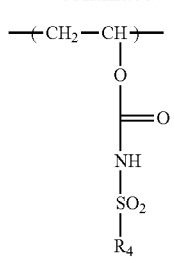

which Structures (Ic) through (If) are described in more detail below.

In Structure (Ia), R is a substituted or unsubstituted hydroxyaryl group such as a substituted or unsubstituted hydroxyphenyl or hydroxynaphthyl group wherein the aryl group has 1 to 3 hydroxyl groups on the ring. Typically, there is only one hydroxyl group on the aryl ring. Other substituents that can optionally be present on the aryl group include but are not limited to, alkyl, alkoxy, halogen, and any other group that does not adversely affect the performance of the outermost resin in the precursor.

$R_2$ is a substituted or unsubstituted hydroxyaryl group in which the hydroxyl group is who to the ester linkage. Some of the $R_2$ groups are substituted with a cyclic imide group, for example a substituted or unsubstituted hydroxyphenyl or hydroxynaphthyl group that has a cyclic imide substituent such as an aliphatic or aromatic imide group, including but not limited to, maleimide, phthalimide, tetrachlorophthalimide, hydroxyphthalimide, carboxypthalimide, and naphthalimide groups. Further optional substituents on $R_2$ include but are not limited to, hydroxyl, alkyl, alkoxy, halogen, and other groups that do not adversely affect the properties of the cyclic imide group or the polymeric binder in the imageable element. A hydroxyphenyl group, with a cyclic imide substituent and no other substituents, is useful in the polymeric binder.

In Structure (Id), $R_1$ is hydrogen or a substituted or unsubstituted linear or branched alkyl group having 1 to 12 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl, iso-hexyl, and dodecyl groups), a substituted or unsubstituted cycloalkyl having 5 to 10 carbon atoms in the carbocyclic ring (such as cyclopentyl, cyclohexyl, 4-methylcyclohexyl, and 4-chlorocyclohexyl), or a substituted or unsubstituted aryl group having 6 or 10 carbon atoms in the aromatic ring (such as phenyl, naphthyl, p-methylphenyl, and p-chlorophenyl). Such groups can be substituted with one or more substituents such as alkyl, alkoxy, and halogen, or any other substituent that a skilled worker would readily contemplate that would not adversely affect the performance of the polymeric binder in the precursor.

In Structure (Ie), $R_3$ is a substituted or unsubstituted linear or branched alkyl group having 1 to 12 carbon atoms, or an aryl group (such as phenyl or naphthyl group) that is substituted with an —$O_x$—$(CH_2)_y$—COOH group wherein x is 0 or 1 and y is 0, 1, or 2. Typically, x is 1 and y is 1, and the aryl group is a phenyl group. This aryl group can have further substituents that do not adversely affect the performance of the outermost resin in the precursor.

In Structure (If), $R_4$ is a substituted or unsubstituted aryl group having 6 or 10 carbon atoms in the aromatic ring (such as phenyl or naphthyl) and that can have one or more substituents such as alkyl, alkoxy, and others that a skilled worker would readily contemplate.

In addition to the outermost resins described above, the outermost ink receptive layer can comprise one or more additional water-insoluble, alkali soluble or -dispersible resins, each comprising a polysiloxane unit segment in a polyurethane or polyurethane urea backbone or side chain for example as described in U.S. Patent Application Publication 2014/0349234 (Tsushima et al.).

Other materials can be present in the outermost ink receptive layer including but not limited to, coating surfactants, dispersing aids, humectants, biocides, viscosity builders, drying agents, defoamers, preservatives, and antioxidants in amounts that are readily apparent to a skilled worker in the art.

The outermost ink receptive layer can further comprise one or more developability enhancing compounds that organic compounds that, when added reduce the minimum exposure energy required to completely remove the outermost ink receptive layer in the exposed regions, relative to the minimum exposure energy required to completely remove the outermost ink receptive layer in the exposed regions except for the exclusion of the organic compound. In addition, such organic compounds can also be characterized as not substantially absorbing exposing radiation selected for the particular outermost ink receptive layer, and generally have a molecular weight of less than 1000 g/mol.

Acidic Developability-Enhancing Compounds (ADEC), such as carboxylic acids or cyclic acid anhydrides, sulfonic acids, sulfinic acids, alkylsulfuric acids, phosphonic acids, phosphinic acids, phosphonic acid esters, phenols, sulfonamides, or sulfonimides can permit further improved developing latitude and printing durability. Representative examples of such compounds are provided in [0030] to [0036] of U.S. Patent Application Publication 2005/0214677 (Levanon et al.), the disclosure of which is incorporated herein by reference.

The outermost ink receptive layer can also comprise one or more developability-enhancing compounds (DEC) as described in U.S. Patent Publication No. 2009/0162783 (noted above). Still other useful developability-enhancing compounds described in this publication have the Structure ($DEC_1$):

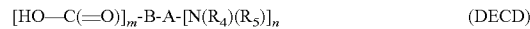

$$[HO-C(=O)]_m\text{-B-A-}[N(R_4)(R_5)]_n \qquad (DECD)$$

wherein $R_4$ and $R_5$ in Structure $DEC_1$ are independently hydrogen or substituted or unsubstituted alkyl groups, substituted or unsubstituted cycloalkyl groups, or substituted or unsubstituted aryl groups, A is an organic linking group that comprises a substituted or unsubstituted phenylene directly attached to —$[N(R_4)(R_5)]_n$, B is a single bond or an organic linking group having at least one carbon, oxygen, sulfur, or nitrogen atom in the chain, m is an integer of 1 or 2, n is an integer of 1 or 2. The "B" organic linking group can be defined the same as A except that it is not required that B contain an arylene group, and usually B, if present, is different than A.

The one or more developability enhancing compounds described above can be generally present in the outermost ink receptive layer in an amount of at least 1 weight % and up to and including 30 weight %.

The outermost ink receptive layer can also comprise thermally inert inorganic particles in an amount of at least 2 weight % and up to and including 20 weight %, or typically of at least 5 weight % and up to and including 15 weight %, based on the total dry weight of the outermost ink receptive layer. These thermally inert inorganic particles generally have an average particle size of at least 0.5 nm and up to and including 1000 nm, or typically of at least 50 nm and up to and including 500 nm. This average size can be determined using known particle evaluation equipment and procedures. The thermally inert inorganic particles are generally discrete, meaning that they are generally uniformly dispersed within the second resin(s). There can be minor amounts of clumping or agglomeration but such forms are not predominant. To achieve uniform dispersion of the inorganic particles, they are usually mixed well within the outermost resin(s) using suitable mixing methods and equipment including high shear mills and preparing a pre-dispersion that is then introduced into the outermost ink receptive layer formulation for application to the layer.

The term "thermally inert" means that the inorganic particles (or organic particles described below) do not measurably add or detract from the infrared radiation imageability of the outermost ink receptive layer. Thus, these inorganic particles do not react with the surrounding outermost resin(s) or other components in the outermost ink receptive layer to any appreciable extent.

Useful thermally inert inorganic particles include various particulate materials that can be readily purchased from various commercial sources, or modified using known procedures. For example, useful materials of this type include but are not limited to, surface-modified silica particles such as fumed silica particles and sol-gel silica particles as described for example in U.S. Pat. No. 8,043,787 (Hauck et al.). Other useful thermally inert inorganic particles include but are not limited to, particles of calcium carbonate, zinc oxide, aluminum oxide, titanium oxide, and zirconium oxide.

The outermost ink receptive layer can alternatively or also comprise thermally inert organic polymer particles that are present in an amount of at least 0.1 weight % and up to and including 5 weight %, or typically of at least 0.2 weight % and up to and including 3 weight %, based on the total dry weight of the outermost ink receptive layer. Such thermally inert organic polymer particles have an average particle size in μm that is at least 1.5 times, or typically from 3 times and up to and including 10 times, the average dry coating weight of the outermost ink receptive layer in $g/m^2$.

Useful thermally inert organic polymer particles generally include minimal inorganic components although the outer surface of the polymer particles can be partially or wholly covered by inorganic materials such as silica particles. Useful organic polymer particles of this type are described for example in U.S. Pat. No. 8,383,319 (Huang et al.) that is incorporated herein by reference, which organic polymer particles comprise a core of crosslinked polymer(s) that generally comprise at least 95% by volume of the organic particles. The remaining amount of the organic polymer particles can comprise grafted hydrophilic polymeric surface groups that are formed on the crosslinked "core" by polymerizing hydrophilic monomers in the presence of the crosslinked polymeric particles.

Other useful thermally inert organic polymer particles are silicate-coated particles having a crosslinked polystyrene core as described in U.S. Pat. No. 7,097,956 (Miyamoto et al.) the disclosure of which is incorporated herein by reference.

The outermost ink receptive layer generally has a dry coating coverage (dry coating weight) of at least 0.2 $g/m^2$ and up to and including 2 $g/m^2$ or typically of at least 0.4 $g/m^2$ and up to and including 1.5 $g/m^2$.

Infrared Radiation Absorbers:

One or more infrared radiation absorbers (described above) are also present in the precursors used in the present invention. Such infrared radiation absorbers can be in the innermost ink receptive layer (if present), the outermost ink receptive layer, or both of the innermost and outermost ink receptive layers. In still other embodiments, they can be within an intermediate layer between the innermost ink receptive layer (when present) and the outermost ink receptive layer. In most embodiments, one or more infrared radiation absorbers are present in the outermost ink receptive layer, or only in the outermost ink receptive layer.

The infrared radiation absorber can be present in the precursor in an amount of at least 0.5 weight % and up to and including 30 weight % and typically in an amount of at least 1 weight % and up to and including 15 weight %, based on the total dry weight of the precursor (minus the weight of the substrate). As noted above, the infrared radiation absorber can be located in one or more layers and the amount of the infrared radiation absorber can be apportioned to the respective layers in a desired manner.

The one or more infrared radiation absorbers are sensitive to near-infrared or infrared radiation, for example of at least 700 nm and to higher wavelengths, or of at least 700 nm and up to and including 1400 nm or more typically of at least 750 nm and up to and including 1250 nm.

For example, useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in U.S. Pat. No. 6,309,792 (Hauck et al.), U.S. Pat. No. 6,569,603 (Furukawa), U.S. Pat. No. 7,135,271 (Kawaushi et al.), the disclosures of which are incorporated herein by reference, and in EP 1,182,033A2 (Sorori et al.).

In addition to low molecular weight IR-absorbers, dyes having IR dye chromophores bonded to polymers can be used as well as infrared radiation absorbers. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.), the disclosures of all of which are incorporated herein by reference. Suitable dyes can be formed using conventional methods and starting materials or obtained from various commercial sources including American Dye Source (Baie D'Urfe, Quebec, Canada) and FEW Chemicals (Germany).

Preparation of Positive-Working Lithographic Printing Plate Precursors

The precursors used in the present invention can be prepared by sequentially applying an innermost ink receptive layer formulation onto the interlayer of the substrate (described above), and if the precursors are dual-layer precursors, and then applying a outermost ink receptive layer formulation over either the substrate or the innermost ink receptive layer (usually when dried) using conventional coating or lamination methods.

The innermost ink receptive layer (when present) and outermost ink receptive layer can be formed by dispersing or dissolving the desired components for each ink receptive layer formulation in a suitable coating solvent, and the resulting formulations are sequentially or simultaneously applied to the substrate (with the interlayer) using suitable equipment and procedures, such as spin coating, knife coating, gravure coating, die coating, slot coating, bar coating, wire rod coating, roller coating, or extrusion hopper coating. The ink receptive layer formulations can also be applied by spraying.

The selection of solvents used to coat each ink receptive layer formulation depends upon the nature of the resins and other components in the layer formulations. To prevent the innermost and outermost ink receptive layer formulations from mixing or the innermost ink receptive layer from dissolving when the outermost ink receptive layer formulation is applied, the outermost ink receptive layer formulation should be coated from a solvent in which the innermost resin(s) in the innermost ink receptive layer are insoluble.

Generally, an innermost ink receptive layer formulation is coated out of a solvent mixture of methyl ethyl ketone (MEK), 1-methoxy-2-propyl acetate (PMA), γ-butyrolactone (BLO), and water, a mixture of MEK, BLO, water, and 1-methoxypropan-2-ol (also known as Dowanol® PM or PGME), a mixture of diethyl ketone (DEK), water, methyl lactate, and BLO, a mixture of DEK, water, and methyl lactate, or a mixture of methyl lactate, methanol, and dioxolane.

An outermost ink receptive layer formulation can be coated out of solvents or solvent mixtures that include but are not limited to, butyl acetate, iso-butyl acetate, methyl iso-butyl ketone, DEK, 1-methoxy-2-propyl acetate (PMA), iso-propyl alcohol, PGME, MEK and mixtures thereof.

After drying the applied ink receptive layer formulations, the lithographic printing plate precursors can be further "conditioned" with a heat treatment for at least 40° C. and up to and including 90° C. for at least 4 hours usually in a stack of multiple precursors (100 or more) with or without interleaving paper. During the heat treatment, the lithographic printing plate precursors are wrapped or encased in a water-impermeable sheet material to represent an effective barrier to moisture removal from the precursors, or the heat treatment of the precursors is carried out in an environment in which relative humidity is controlled to at least 25%.

Exposure Conditions

During the practice of the method of this invention, the positive-working lithographic printing plate precursor is exposed to a suitable source of exposing infrared radiation depending upon the infrared radiation absorber present in the precursor to provide specific sensitivity that is at a wavelength of at least 700 nm and up to and including 1400 nm, or more likely of at least 750 nm and up to and including 1400 nm. Imagewise exposing provides exposed regions and non-exposed regions in the innermost first ink receptive layer (when present) and in the outermost ink receptive layer.

Exposure with infrared radiation can be carried out generally at exposing energies of at least 30 mJ/cm² and up to and including 500 mJ/cm² and typically at least 50 mJ/cm² and up to and including 300 mJ/cm² depending upon the sensitivity of the imageable layer.

Development and Printing

After exposure, the exposed lithographic printing plate precursors can be processed using a suitable silicate-free developer composition (or silicate-free processing solution) of the present invention as described below. When the positive-working lithographic printing plate precursors are exposed and processed, the exposed regions in the innermost ink receptive layer (when present) and the outermost ink receptive layer are removed during processing while the non-exposed regions remain for inking receptivity.

Development can be accomplished using an automatic development apparatus (processor) where the exposed precursor is dipped in a tank or tray containing the appropriate silicate-free developer composition for at least 10 seconds and up to and including 60 seconds (especially at least 20 seconds and up to and including 40 seconds) under agitation, followed by rinsing with water with or without rubbing. The apparatus can also include a suitable rubbing mechanism (for example, one or more brushes or rollers) inside the developing tank and a suitable number of conveyance rollers.

The silicate-free developer compositions of this invention have a pH of at least 12.5 and up to and including 14, or more likely at least 12.5 and up to and including 13.5. By "silicate-free," it is meant that the silicate-free developer compositions of this invention contain less than 0.5 weight % of silicates and metasilicates, or even less than 0.1 weight %, all based on the total silicate-free developer composition weight.

Some components of useful silicate-free developer compositions are described in U.S. Patent Application Publication 2012/0125216 (Levanon et al.) the disclosure of which is incorporated herein by reference. The silicate-free developer compositions of this invention generally comprise one or more alkali agents other than silicates and metasilicates. Such useful alkali agents include alkali metal hydroxides such as sodium hydroxide and potassium hydroxide, or combinations thereof, sufficient to provide the desired pH. Potassium ions can be more prevalent than the sodium ions and the total amount of the alkali metal ions is generally at least 0.3 gram-atom/kg and up to and including 1 gram-atom/kg.

Each silicate-free developer composition of this invention comprises one or more coating protecting agents that are selected from the group consisting of quaternary ammonium salts and phosphonium salts, or mixtures of both types of salts.

Quaternary ammonium salts that are useful as coating protecting agents can be represented by the general formula (Q):

$$N(R_1R_2R_3R_4)^+X^- \tag{Q}$$

wherein $R_1$, $R_2$, $R_3$, and $R_4$ are independently hydrocarbon groups connected directly to the nitrogen atom, each hydrocarbon group comprising sufficient carbon atoms so that the total number of carbon atoms for the four $R_1$, $R_2$, $R_3$, and $R_4$ hydrocarbon groups is at least 15 and up to and including 30 and the maximum number of carbon atoms in each one of the $R_1$, $R_2$, $R_3$, and $R_4$ groups is at least 5 and up to and including 22 carbon atoms. Typically this total of carbon atoms for the four hydrocarbon groups is at least 15 and up to and including 24 and the maximum number of carbon atoms in each one of the $R_1$, $R_2$, $R_3$, and $R_4$ groups is at least 5 and up to and including 18. Each hydrocarbon group can also be substituted as long as the substituents do not adversely affect the desired properties of the compound. Useful hydrocarbon groups include but are not limited to alkyl groups, cycloalkyl groups, and aryl groups, or any combination of alkyl, cycloalkyl, and aryl groups (for example, an aralkyl group or alkaryl group).

In some embodiments of the silicate-free developer composition, at least one of the $R_1$, $R_2$, $R_3$, and $R_4$ hydrocarbon groups is an alkyl group.

In other embodiments, none of the $R_1$, $R_2$, $R_3$, and $R_4$ hydrocarbon groups is an aryl group with its aromatic ring connected directly to the nitrogen atom shown in formula (Q).

$X^-$ is a suitable anion such as fluoride, chloride, or bromide. Other useful anions include various sulfonates such as p-toluenesulfonate and trifluoromethane sulfonate. Typically, $X^-$ is bromide or chloride.

Optionally, two or more of the $R_1$, $R_2$, $R_3$, and $R_4$ hydrocarbon groups can be connected to each other to form one or more heterocyclic ring structures with the illustrated nitrogen atom.

Some particularly useful quaternary ammonium salts include but are not limited to, octyltri-n-butyl ammonium chloride, dodecyltrimethyl ammonium bromide, tetra(pentyl)ammonium bromide, myristyl trimethyl ammonium bromide, cetyl trimethyl ammonium bromide, benzyl octyldimethyl ammonium chloride, and benzyldimethylstearylammonium chloride.

Phosphonium salts useful as coating protecting agents in the silicate-free developer composition of the present invention can be represented by the general formula (P):

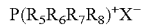

$$P(R_5R_6R_7R_8)^+X^- \tag{P}$$

wherein $R_5$, $R_6$, $R_7$, and $R_8$ are independently hydrocarbon groups connected directly to the phosphorus atom and are defined similarly to the $R_1$ through $R_4$ groups described above, and a compound from the general formula (Q) and from the general formula (P) can have the same or different hydrocarbon groups. Moreover, each hydrocarbon group comprises sufficient carbon atoms so that the total number of carbon atoms in the four $R_5$, $R_6$, $R_7$, and $R_8$ hydrocarbon groups is at least 15 and up to and including 30 and the maximum number of carbon atoms in each one of the $R_5$, $R_6$, $R_7$, and $R_8$ groups is at least 5 and up to and including 22 carbon atoms.

In view of the need to have good chemical stability against decomposition in high pH aqueous solution, typically at least one of the $R_5$, $R_6$, $R_7$, and $R_8$ groups is an alkyl group. In some embodiments, none of the $R_5$, $R_6$, $R_7$, and $R_8$ groups is an aryl group with its aromatic ring connected directly to the phosphorus atom shown in formula (P).

$X^-$ is an anion as defined above.

Optionally, two or more of the $R_5$, $R_6$, $R_7$, and $R_8$ hydrocarbon groups can be connected to each other to form one or more heterocyclic ring structures with the illustrated phosphorus atom.

Some representative phosphonium salts useful in the present invention include but are not limited to, octyltri-n-butyl phosphonium chloride, octyltri-n-butyl phosphonium bromide, tetradecyl tributyl phosphonium bromide, dodecyl tributyl phosphonium bromide, and dodecyl trimethyl phosphonium chloride.

Mixtures of quaternary ammonium salts, mixtures of phosphonium salts, or mixtures of one or more quaternary ammonium salts and one or more phosphonium salts, can be used in the silicate-free developer compositions of this invention.

Useful quaternary ammonium salts and phosphonium salts are generally available from various commercial sources.

The one or more quaternary ammonium salts, one or more phosphonium salts, or combinations of both types of salts, can be present in the silicate-free developer compositions of this invention in an amount of at least 0.001 weight % and up to and including 2 weight %, or more likely in an amount of at least 0.03 weight % and up to and including 0.5 weight %, all based on the total weight of the silicate-free developer composition (including water).

The silicate-free developer compositions of this invention also include one or more "moderators" for the coating protecting agents. Such "moderators" allow the use of relatively high amount of strong coating protecting agent (quaternary ammonium salt or phosphonium salt as described above) that would normally hamper clean removal of the ink receptive layer composition in the infrared radiation laser exposed areas in the absence of such a moderator. Thus the combination of a moderator according to formula (I) and sufficient amount of a strong coating protecting agent in the silicate-free developer composition according to the present invention allows consistent removal of the ink receptive layer(s) of a lithographic printing plate precursor in the infrared laser exposed areas without damaging the ink receptive layer(s) in the non-exposed areas.

Suitable moderators according to the present invention comprise compounds represented by the following Structure (I):

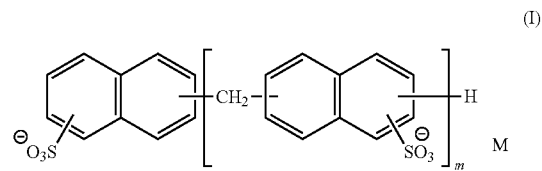

wherein m is at an integer of at least 1 and up to and including 10, or typically an integer of at least 1 and up to and including 3, and M represents one or more cations to balance the negatively charged sulfonate groups. For example, M can comprise alkali metal ions or the cations present in the coating protecting agents or both.

The moderators represented by Structure (I) can be prepared using methods described in U.S. Pat. No. 2,802,845 (Sadler et al.) or they can be obtained from various commercial sources.

The useful amounts of the one or more moderators in the silicate-free developer composition is at least 0.1 weight % and up to and including 5 weight %, or typically at least 0.5 weight % and up to and including 3 weight %, all based the total weight of the silicate-free developer composition (including water).

In many embodiments, the silicate-free developer compositions also include one or more metal cations ($M^{2+}$) that are generally selected from the group consisting of barium, calcium, strontium, magnesium, nickel and zinc cation. Barium, calcium, strontium, and zinc cations are particularly useful, and mixtures of these cations can be used if desired. The metal cations $M^{2+}$ are generally present in the processing solutions in an amount of at least 0.0001 gram-atom/kg, and typically of at least 0.001 gram-atom/kg and up to and including 0.01 gram-atom/kg. The desired cations can be provided in the forms of various water-soluble salts that would be readily apparent to one skilled in the art. Examples of such salts are calcium chloride, barium chloride, strontium chloride, zinc acetate, calcium bromide, and calcium nitrate.

In addition, the silicate-free developer compositions can also include one or more chelating agents, each of which has a complex formation constant (log K) for the $M^{2+}$ metal cation of at least 3.5 and less than or equal to 4.5, and a complex formation constant (log K) for aluminum ion that is 7 or less. Useful chelating agents with these properties include but are not limited to, phosphono-polycarboxylic acids such as phosphonoalkyl polycarboxylic acids, such as 2-phosphonobutane-1,2,4-tricarboxylic acid, which is particularly useful with calcium metal cations.

The described chelating agents can be present in the silicate-free developer composition in an amount of at least 0.001 mol/liter and up to and including 0.1 mol/liter, or typically at least 0.03 mol/liter and up to and including 0.1 mol/liter.

The silicate-free developer compositions can also comprise one or more nonionic surfactants to achieve the best wetting, stabilizing, solubilizing, protecting, dispersing, and rinsing properties. The nonionic surfactants can be present in an amount of at least 0.1 weight % and up to and including 2 weight %.

Other components of the silicate-free developer compositions include alkali metal salts other than those described above in an amount of at least 0.005 mol/liter. Useful alkali metal salts include trisodium citrate, disodium malonate, sodium gluconate, and sodium succinate.

Particularly useful silicate-free developer compositions have a pH of at least 12.5 and up to and including 14 and comprise calcium or strontium metal cations, a sodium or potassium hydroxide, 2-phosphonobutane-1,2,4-tricarboxylic acid, a coating protecting agent, and a moderator as described above.

In some embodiments, the silicate-free developer compositions comprise:

a coating protecting agent that is a quaternary ammonium salt or a phosphonium salt represented by the formulae (Q) and (P) described above, the silicate-free developer composition further comprising $M^{+2}$ metal cations that are barium, calcium, strontium, or zinc cations, or a combination thereof, in an amount of at least 0.001 gram-atom/kg, and a chelating agent that has a complex formation constant (log K) for the barium, calcium, strontium, or zinc $M^{+2}$ metal cation of at least 3.5 and less than or equal to 4.5, and a complex formation constant (log K) for aluminum ion of 7 or less, which chelating agent is present in an amount of at least 0.03 mol/liter.

Although each silicate-free developer composition can also be used as its own replenisher, in addition, a specially formulated replenisher can be used. In the replenisher composition, the concentration of alkali metal hydroxide is generally higher than the concentration of the alkali metal hydroxide in the working strength silicate-free developer composition, to compensate for the consumption of the alkali metal hydroxide during development.

Following development (or processing) of the exposed precursor, the resulting lithographic printing plate can be baked at a temperature in a range of from 180° C. and up to and including 280° C. for at least 1 minute and up to and including 10 minutes.

Printing can be carried out by putting the exposed and developed lithographic printing plate on a suitable lithographic printing press using a suitable fountain solution and lithographic printing ink applied to the printing surface of the lithographic printing plate. The lithographic printing ink is transferred to a suitable receiving material (such as cloth, paper, metal, glass, or plastic) to provide a desired impression.

The present invention provides at least the following embodiments and combinations thereof, but other combinations of features are considered to be within the present invention as a skilled artisan would appreciate from the teaching of this disclosure:

1. A silicate-free developer composition having a pH of at least 12.5, and comprising:

an alkali metal hydroxide present in an amount sufficient to provide the pH of at least 12.5;

a coating protecting agent, and a moderator for the coating protecting agent that is represented by the following general formula (I):

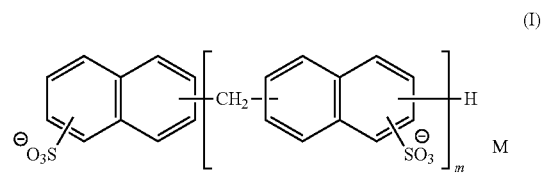

wherein m is at an integer of at least 1 and up to and including 10, and M represents one or more counterions sufficient to balance the negatively-charged sulfonate groups, wherein the coating protecting agent is a quaternary ammonium salt or a phosphonium salt represented by the following formulae (Q) and (P), respectively, or a mixture thereof:

wherein $R_1$, $R_2$, $R_3$, and $R_4$ are independently hydrocarbon groups connected directly to the nitrogen atom, each hydrocarbon group comprising sufficient carbon atoms so that the total number of carbon atoms for the four $R_1$, $R_2$, $R_3$, and $R_4$ hydrocarbon groups is at least 15 and up to and including 30, the maximum number of carbon atoms in each one of $R_1$, $R_2$, $R_3$, and $R_4$ is at least 5 and up to and including 22, and optionally, two or more of the $R_1$, $R_2$, $R_3$, and $R_4$ hydrocarbon groups can be connected to each other to form one or more heterocyclic ring structures with the illustrated nitrogen atom;

wherein $R_5$, $R_6$, $R_7$, and $R_8$ are independently hydrocarbon groups connected directly to the phosphorus atom, each hydrocarbon group comprising sufficient carbon atoms so that the total number of carbon atoms for the four $R_5$, $R_6$, $R_7$, and $R_8$ hydrocarbon groups is at least 15 and up to and including 30, the maximum number of carbon atoms in each one of $R_5$, $R_6$, $R_7$, and $R_8$ is at least 5 and up to and including 22, and optionally, two or more of the $R_5$, $R_6$, $R_7$, and $R_8$ hydrocarbon groups can be connected to each other to form one or more heterocyclic ring structures with the illustrated phosphorus atom; and $X^-$ is an anion.

2. The silicate-free developer composition of embodiment 1, wherein at least one of the $R_1$, $R_2$, $R_3$, and $R_4$ hydrocarbon groups, or at least one of the $R_5$, $R_6$, $R_7$ and $R_8$ hydrocarbon groups is an alkyl group.

3. The silicate-free developer composition of embodiment 1 or 2, wherein none of the $R_5$, $R_6$, $R_7$ and $R_8$ hydrocarbon groups is an aryl group with its aromatic ring connected directly to the phosphorus atom shown in formula (P).

4. The silicate-free developer composition of any of embodiments 1 to 3, wherein none of the $R_1$, $R_2$, $R_3$, and $R_4$ hydrocarbon groups is an aryl group with its aromatic ring connected directly to the nitrogen atom shown in formula (Q).

5. The silicate-free developer composition of any of embodiments 1 to 4, wherein the quaternary ammonium salt, phosphonium salt, or combination thereof, is present in an amount of at least 0.001 weight % and up to and including 2 weight %, based on the total weight of the silicate-free developer composition.

6. The silicate-free developer composition of any of embodiments 1 to 5, wherein the quaternary ammonium salt, phosphonium salt, or combination thereof, is present in an amount of at least 0.03 weight % and up to and including 0.5 weight %, based on the total weight of the silicate-free developer composition.

7. The silicate-free developer composition of any of embodiments 1 to 6, that further comprises $M^{+2}$ metal cation is a barium, calcium, strontium, or zinc cation, or combination thereof, in an amount of at least 0.0001 gram-atom/kg.

8. The silicate-free developer composition of embodiment 7 further comprising a chelating agent that has a complex formation constant (log K) for the $M^{+2}$ metal cation of at least 3.5 and less than or equal to 4.5, and a complex formation constant (log K) for aluminum ion of 7 or less.

9. The silicate-free developer composition of embodiment 8, wherein the chelating agent is a phosphono-polycarboxylic acid that is present in an amount of at least 0.001 mol/liter.

10. The silicate-free developer composition of any of embodiments 1 to 9, wherein the moderator is present in an amount of at least 0.1 weight % and up to and including 5 weight %, based on the total weight of the silicate-free developer composition.

11. The silicate-free developer composition of any of embodiments 1 to 10 that further comprises an alkali metal salt in an amount of at least 0.001 mol/liter.

12. The silicate-free developer composition of any of embodiments 1 to 11, wherein m is an integer of at least 1 and up to and including 3.

13. A method for forming a lithographic printing plate, the method comprising:

imagewise exposing a positive-working lithographic printing plate precursor with infrared radiation to form an exposed precursor comprising exposed regions and non-exposed regions, and processing the exposed precursor to remove the exposed regions using the silicate-free developer composition of any of embodiments 1 to 12 to provide a lithographic printing plate, wherein the positive-working lithographic printing plate precursor comprises:

a grained and anodized aluminum-containing substrate, an outermost ink receptive layer disposed over the grained and anodized aluminum-containing substrate, the outermost ink receptive layer comprising at least one water-insoluble, alkali solution-soluble or -dispersible outermost resin that is a phenolic resin, and optionally, an innermost ink receptive layer that is disposed between the grained and anodized aluminum-containing substrate and the outermost ink receptive layer, the innermost ink receptive layer comprising at least one water-insoluble, alkali solution-soluble or -dispersible innermost resin that is different from the water-insoluble, alkali solution-soluble or -dispersible outermost resin, the positive-working lithographic printing plate precursor further comprising an infrared radiation absorber.

14. The method of embodiment 13, wherein the water-insoluble, alkali solution-soluble or -dispersible outermost resin is a phenolic resin.

15. The method of embodiment 13, wherein the water-insoluble, alkali solution-soluble or -dispersible outermost resin comprises recurring units having an acetal structure.

16. The method of any of embodiments 13 to 15, wherein the positive-working lithographic printing plate precursor further comprises the innermost ink receptive layer that comprises a water-insoluble, alkali solution-soluble or -dispersible innermost resin that is a polymer comprising recurring units derived from one or more of a styrene, an alkyl (meth)acrylate, (meth)acrylic acid, (meth)acrylamide, (meth)acrylonitrile, N-phenyl maleimide, N-alkoxymethyl (meth)acrylamide, and 5-methacrylamido tetrazole.

17. The method of any of embodiments 13 to 16, wherein the infrared radiation absorber is present in at least the outermost ink receptive layer in an amount of at least 0.5 weight %, based on the total dry weight of the precursor minus the weight of the substrate.

18. The method of any of embodiments 13 to 17, wherein the outermost ink receptive layer further comprises thermally inert inorganic particles in an amount of at least 2 weight % and up to and including 20 weight %, based on the total dry weight of the outermost ink receptive layer, which thermally inert inorganic particles have an average particle size of at least 0.5 nm and up to and including 500 nm.

19. The method of any of embodiments 13 to 18, wherein the outermost ink receptive layer further comprises thermally inert organic polymer particles that are present in an amount of at least 0.1 weight % and up to and including 5 weight %, based on the total dry weight of the outermost ink receptive layer, which thermally inert organic polymer particles have an average particle size in μm that is at least 1.5 times average dry coating weight of the outermost ink receptive layer in $g/m^2$.

20. The method of any of embodiments 13 to 19, wherein the positive-working lithographic printing plate precursor further comprises:

a poly(vinyl phosphonic acid) interlayer that optionally comprises phosphoric acid or a salt thereof comprising aluminum cations, which poly(vinyl phosphonic acid) interlayer is disposed directly on the grained and anodized aluminum-containing substrate.

21. The method of any of embodiments 13 to 20, further comprising baking the lithographic printing plate after processing the exposed precursor.

22. The method of any of embodiments 13 to 21, wherein the silicate-free developer composition further comprises $M^{+2}$ metal cations that are barium, calcium, strontium, or zinc cations, or a combination thereof, in an amount of at least 0.001 gram-atom/kg, and a chelating agent that has a complex formation constant (log K) for the $M^{+2}$ metal cation of at least 3.5 and less than or equal to 4.5, and a complex formation constant (log K) for aluminum ion of 7 or less, which chelating agent is present in an amount of at least 0.03 mol/liter.

The following Examples are provided to illustrate the practice of this invention and are not meant to be limiting in any manner. The following materials were used to prepare the lithographic printing plate precursors used in the Examples:

BLO represents γ-butyrolactone.
MEK represents 2-butanone.
Byk ® 307 is a polyethoxylated dimethylpolysiloxane copolymer (Byk Chemie or Altana) that is used as a leveling agent.
Binder 1 was a polymer prepared from the monomers 2-methacrylamido-1H-tetrazole/methacrylic acid/N-methoxymethyl methacrylamide/N-phenyl maleimide/acrylonitrile at a monomer weight ratio of 15.0/4.2/12.6/23.5/44.7 and having an acid number of 82 mg KOH/g of Binder 1.
Binder 2 was a polyurethane resin made using reactants dimethylolpropionic acid/1,4 butanediol/KF-6001 silicon diol (from Shinetsu, Japan)/4,4'-diphenylmethane diisocyanate in a reactant weight ratio of 24/5.76/10.56/59.69.
Binder 3 was a polyvinyl acetal having 25 mol % of recurring units with acetal units derived from butyral, 59 mol % recurring acetal units derived from 2-salicyldehyde, 2 mol % of vinyl acetate units and the rest being vinyl alcohol recurring units from PVA 203 used as the starting material (a polyvinyl alcohol from Kuraray Corporation, Japan).
Substrate A was a 0.3 mm gauge aluminum sheet that had been electrochemically grained and anodized, having an Ra of 0.35 and that had been treated with a solution containing 2.4 g/l of poly(vinyl phosphonic acid) and 2 g/l of phosphoric acid using a spray bar process at 65° C. and 6 seconds dwell time, followed by rinsing and drying, to provide a poly(vinyl phosphoric acid) interlayer.
Solvent Mixture A was a mixture of MEK/Dowanol® PM/-BLO/H$_2$O/Dioxalane at a weight ratio of 45/20/10/10/15.
Dowanol ® PM is a glycol ether solvent (Dow Chemical Company).
LB9900 is a resole resin that was obtained from Hexion AG.

IR Dye A is represented by the following structure (Eastman Kodak Company):

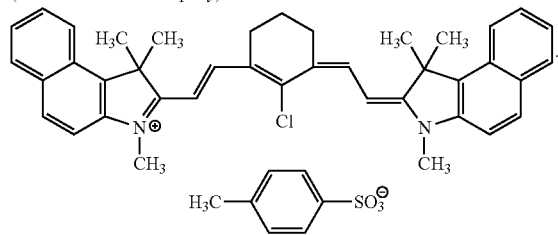

4-DMABA represents 4-(dimethyl amino)benzoic acid.
Naphthol blue black was obtained from ORGANICA Feinchemie GmbH (Wolfen, Germany).

Violet 612 is a visible dye having the following structure:

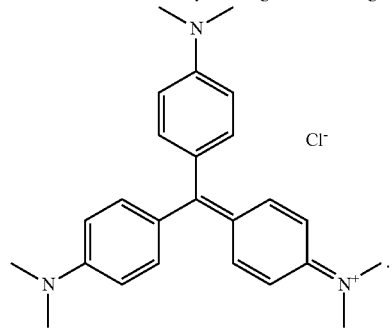

Dispersion A was a 10 w/w % dispersion of Aerosil R9200 (Evonik) and Binder 3 at a 9:1 weight ratio made by ball milling in Dowanol ® PM to a particle size distribution of 50% < 0.5 μm (Masterizer).
Bayhibit ® AM is 2-phosphonobutane-1,2,4-tricarboxylic acid (Lanxess) used as a complexing agent for calcium cations.
Cyphos ® IL 253 is octyltributyl phosphonium chloride (Cytec).
PC1742 is a condensate of naphthalene sulfonic acid with formaldehyde (Polygon Chemie).
Tamol ® NH7519 is a naphthalene sulfonic acid formaldehyde condensate, 1% sodium sulfate (BASF).
Demol N is a naphthalene sulfonic acid formaldehyde condensate (Kao Corporation).
Aron A6031 is a sodium salt of a polymeric carboxylic acid (available from Toagasei Co., Ltd., Japan).
Naxan ® ABL is a methyl and ethyl naphthalene sulfonate, sodium salt (Nease Corporation).
Akypo ® LF2 is capryleth-9-carboxylic acid (Kao Chemicals).
Sokalan PA40 is a poly(acrylic acid, sodium salt) (BASF).

Lithographic Printing Plate Precursor A:
An innermost ink receptive layer was prepared with a formulation made by dissolving 9.78 g of Binder 1 and 0.2 g of Naphthol Blue Black in 120 g of Solvent Mixture A and coating the formulation onto Substrate A and drying the coating at 80° C. for 2 minutes to provide a dry coating weight of 0.8 g/m$^2$.
An outermost ink receptive layer was prepared with a formulation made by dissolving 6.95 g of Binder 3 premix (20 weight % Binder 3 and 80% Dowanol® PM), 1.20 g of LB9900, 0.06 g of IR Dye A, 0.024 g of Violet 612, 0.154 g of DMABA, 0.12 g of Binder 2, 1.23 g of Dispersion A, and 0.024 g of Byk® 307 in 51.4 g of a solvent mixture made up with MEK and Dowanol® PM at a 35:65 weight ratio. This formulation was applied over the innermost ink receptive layer coating and drying at 80° C. for 2 minutes to provide a dry coating weight of 0.8 g/m$^2$.
Lithographic Printing Plate Precursor A obtained in this manner was further treated at 60° C. and 25% relative humidity for 48 hours.
Lithographic Printing Plate Precursor B:
This precursor was prepared according to Invention Example 2 of
U.S. Patent Application Publication 2009/0162783A (Levanon et al.) having the positive-working ink receptive layer formulation shown in [0213] and containing DMABA as a developability enhancing compound. The disclosure of this precursor composition and its preparation in this publication is incorporated herein by reference.

Invention Example 1

Lithographic Printing Plate Precursor A was imagewise exposed using a Trendsetter Quantum 800 Plate setter (available from Eastman Kodak Company) and processed with the silicate-free developer composition (Developer 1) according to the present invention and having the formulation shown in the following TABLE I.

TABLE I

| Component | Amount (g) |
| --- | --- |
| Deionized water | 89.26 |
| Calcium chloride 2× H$_2$O | 0.03 |
| Bayhibit ® AM | 0.38 |
| Citric acid · H$_2$O | 1.07 |
| Potassium hydroxide (45% solution) | 8.01 |
| PC1742 moderator for the coating protecting agent | 1.20 |
| Cyphos ® IL 253 coating protecting agent | 0.05 |

The performance of the combination of Lithographic Printing Plate Precursor A and Developer 1 were evaluated using a number of tests, as described below and the results are shown below in TABLE II. For Invention Example 1, the good results were retained when the amount of PC1742 moderator for the coating protecting agent was reduced to 1.0, 0.8, and 0.6 weight % from 1.2 weight %.

Invention Example 2

Invention Example 1 was repeated except that PC1742 moderator for the coating protection agent in Developer 1 was replaced with 1 weight % Tamol® NH4501 moderator to form Developer 2. The test results for Invention Example 2 are shown below in TABLE II. The turbidity test was also carried out after Developer 2 had been stored at 60° C. and 40° C. for 24 hours. Some turbidity was observed after storage at such higher temperatures but not after storage at ambient temperature of about 25° C.

Invention Example 3

Invention Example 1 was repeated except that PC1742 moderator for the coating protection agent in Developer 1 was replaced with 1 weight % Tamol® NI-17519 moderator and the amount of the coating protection agent Cyphos® IL253 was increased from 0.05 weight % to 0.1 weight % to form Developer 3 (the was balanced by adjusting the amount of water). The test results for Invention Example 3 are shown below in TABLE II. Developer 3 remained clear after storage at 60° C. for 24 hours.

Comparative Example 1

Invention Example 1 was repeated except that PC1742 moderator in Developer 1 was replaced with Naxan® ABL to form Developer C1 that is outside the scope of the present invention. As TABLE II shows, Developer C1 exhibited turbidity at room temperature.

Comparative Example 2

Invention Example 1 was repeated except that PC1742 moderator in Developer 1 was replaced with benzene-1,3-disulfonate to form Developer C2 that is outside the scope of the present invention. As TABLE II shows, Developer C2 exhibited turbidity at room temperature.

Comparative Example 3

Invention Example 1 was repeated except that PC1742 moderator in Developer 1 was replaced with poly(styrene sulfonate, sodium salt) (obtained from Sigma-Aldrich) to form Developer C3 that is outside the scope of the present invention. As TABLE II shows, Developer C3 exhibited turbidity at room temperature and failed the Drop Test.

Comparative Examples 4 and 5

Invention Example 1 was repeated except that PC1742 moderator in Developer 1 was replaced with two polymers each having pendant carboxylate anions. For Comparative Example 4, the polymer was Sokalan PA40 to form Developer C4 that is outside the scope of the present invention, and for Comparative Example 5, the polymer was Aron A6031 to form developer C5 that also is outside the scope of the present invention. Developers C4 and C5 failed the Drop Test meaning that development of Lithographic Printing Plate Precursor A was too "slow" using Developers C4 and C5, as an additional 20 seconds development time was needed to remove ink receptive layer coatings in the IR-exposed regions.

Comparative Example 6

Invention Example 1 was repeated except that PC1742 moderator in Developer 1 was replaced with 3 weight % of Akypo® LF2 to form Developer C6 that is outside the scope of the present invention. As TABLE II shows, Developer C6 failed the Sharpening Test.

Comparative Example 7

Invention Example 1 was repeated except that PC1742 moderator in Developer 1 was omitted to form Developer C7 that is outside the present invention. Development using Developer C7 was very slow and required an additional 16 seconds soaking time to completely remove ink receptive layer coatings in the IR-exposed regions of Lithographic Printing Plate A. Development speed was improved by reducing the amount of Cyphos® IL253 coating protecting agent from 0.05 weight % to 0.03 weight % to form Developer C7(a) that is outside the scope of the present invention. However, Developer C7(a) failed the Sharpening Test.

Invention Example 4

Invention Example 1 was repeated except that Cyphos® IL 253 coating protecting agent was replaced with tetra(pentyl)ammonium bromide as a coating protecting agent to form Developer 3. The test results are shown below in TABLE II.

Invention Example 5

Invention Example 1 was repeated except that Cyphos® IL 253 coating protecting agent was replaced with dodecyltrimethyl ammonium bromide as a coating protecting agent to form Developer 4. The test results are shown below in TABLE II.

Comparative Example 8

Invention Example 1 was repeated except that Cyphos® IL 253 coating protecting agent was replaced with tetrabutylammonium bromide as a coating protecting agent to form Developer C8 that is outside the scope of the present invention due to the maximum number of carbon atoms in each of the hydrocarbon groups connected to the ammonium nitrogen is less than 5. As shown in TABLE II below, Developer C8 failed the Soak Test and exhibited significant attack on the non-exposed ink receptive layers in Lithographic Printing Plate Precursor A.

Invention Example 6

Invention Example 1 was repeated except that the amount of Cyphos® IL 253 coating protecting agent was doubled in concentration to form Developer 5. The test results are shown below in TABLE II.

Invention Example 7

Invention Example 1 was repeated except that the amount of Cyphos® IL 253 coating protecting agent was tripled in concentration and the PC 1742 moderator was also tripled in concentration to form Developer 6. The test results are shown below in TABLE II.

Invention Example 8

Invention Example 1 was repeated except that the Lithographic Printing Plate Precursor A was replaced with Lithographic Printing Plate Precursor B. The results of the various tests are shown below in TABLE II.

The performance of the combinations of Lithographic Printing Plate Precursor A or B and the various developers were evaluated using a number of tests, as described as follows.

Clear Point Test:

To assess the photospeed, each precursor was exposed with test patterns comprising solids and 8×8 checkerboard at 6W to 18W in steps of 1W using a Kodak Quantum 800 PlateSetter to deliver 40 to 120 $mJ/cm^2$ energy to the fully exposed areas of the precursor. Each exposed precursor was developed by placing it in a dish containing a developer for a 10 seconds followed by rubbing the processed precursor with a soft paper tissue for 10 seconds and then rinsing the resulting lithographic printing plate with water. The developed lithographic printing plate was dried and then evaluated for the clear point that is defined as the minimum energy ($mJ/cm^2$) to give a clear background.

Developer Resistance (Soak Test):

To assess the resistance of each precursor to the developer, drops of the developer maintained as 25° C. were placed on the outermost ink receptive layer of the non-exposed precursor at 10 second time intervals and the developer was rinsed off when the first drop had remained for 90 seconds. The optical density (OD) was measured using a densitometer (a DI 96 densitometer from Gretag MacBeth, Regensdorf, Switzerland) fitted with a cyan filter at each of the areas treated with the developer drops. The remaining % OD relative to the OD measured from the original precursor was noted at 50 seconds. An acceptable Soak Test evaluation was scored as "+" when at least 70% of the outermost ink receptive layer coating OD remained after the test.

Developing Speed (Drop Test):

To assess the speed of development, each precursor was exposed at 15W/360 rpm (100 $mJ/cm^2$ delivered to the fully exposed areas) as described for the Clear Point test. Drops of the developer maintained at 25° C. were placed on the outermost ink receptive layer surface of a strip of each exposed precursor at 2 second intervals at various dwell times and rinsed off when the first drop had remained for 30 seconds. The drop tested regions were then partially inked. The minimum dwell time showing complete dissolution of the outermost ink receptive layer and the innermost ink receptive layer, if present, and the inked region that was free of toning (inked Drop Test) were noted. The drop test is considered satisfactory (scored as "+") when the minimum dwell time was within the range of from 12 seconds to 14 seconds. If the minimum dwell time was longer than 14 seconds, the drop test result was considered too slow. On the other hand, if the minimum dwell time was less than 12 seconds, the drop test result was considered unsatisfactory due to narrow processing latitude for keeping the fine dots on the resulting lithographic printing plate. For both types of evaluations (<12 seconds or >14 seconds), the drop test result is scored as "−".

Developer Sharpening (Sharpening Test): Developer sharpening is a phenomenon that may occur as more and more exposed precursors are loaded in a developer and the activity of the developer become "sharper". To simulate this effect, a cuvette loading was conducted to 3 $m^2$/liter with the exposed precursor in 300 ml of the developer. The Soak Test was carried out both before and after the loading was measured. Sharpening was detected when the Soak Test became much worse after the cuvette loading and the result was scored as "−". Otherwise, this test result was scored as "+".

Sludge Assessment:

Sludge occurs when the materials removed from the exposed precursor do not dissolve in the developer or as a result of corrosion products arising from the aluminum or aluminum oxide in the substrate. At the end of the 3 $m^2$/liter loading in the cuvette, the developer was allowed to stand for a day and checked for sediments (deposits). In the optimum case (scored as "+"), no deposits were detected. If deposits were observed, the result was scored as "−".

Developer Turbidity:

The developer was visually inspected for turbidity after all components are added in water and stirred at room temperature (~25° C.) for 24 hours. The turbidity was scored "+" when the developer was clear.

The results of the evaluations are summarized as:

+=good

−=poor

NT=not tested (typically due to failure in other properties such as the Drop Test result).

Results and Discussion:

The results of the performance evaluations are shown in the following TABLE II.

TABLE II

| Example | Developer | Precursor | Drop Test | Soak Test | Turbidity | Sludge | Sharpening Test |
|---|---|---|---|---|---|---|---|
| Invention 1 | 1 | A | + | + | + | + | + |
| Invention 2 | 2 | A | + | + | + | + | + |
| Invention 3 | 3 | A | + | + | + | + | + |
| Comparative 1 | C1 | A | + | + | − | + | + |
| Comparative 2 | C2 | A | + | + | − | + | + |
| Comparative 3 | C3 | A | − | + | − | + | + |
| Comparative 4 | C4 | A | − | + | + | + | + |
| Comparative 5 | C5 | A | − | + | + | + | + |
| Comparative 6 | C6 | A | + | + | + | + | − |
| Comparative 7 | C7 | A | − | + | + | + | NT |
|  | C7(a) | A | + | + | + | + | − |
| Invention 4 | 3 | A | + | + | + | + | + |
| Invention 5 | 4 | A | + | + | + | + | + |
| Comparative 8 | C8 | A | + | − | + | + | + |
| Invention 6 | 7 | A | + | + | + | + | + |
| Invention 7 | 6 | A | + | + | + | + | + |
| Invention 8 | 7 | B | + | + | + | + | + |

The invention has been described in detail with particular reference to certain specific embodiments thereof, but it will be understood that variations and modifications can be effected within the spirit and scope of the invention.

The invention claimed is:

1. A method for forming a lithographic printing plate, the method comprising:

imagewise exposing a positive-working lithographic printing plate precursor with infrared radiation to form an exposed precursor comprising exposed regions and non-exposed regions, and processing the exposed precursor to remove the exposed regions using a silicate-free developer composition to provide a lithographic printing plate, wherein the positive-working lithographic printing plate precursor comprises:

a grained and anodized aluminum-containing substrate, an outermost ink receptive layer disposed over the grained and anodized aluminum-containing substrate, the outermost ink receptive layer comprising at least one water-insoluble, alkali solution-soluble or -dispersible outermost resin that is a phenolic resin, wherein the outermost ink receptive layer further comprises thermally inert inorganic particles in an amount of at least 2 weight % and up to and including 20 weight %, based on the total dry weight of the outermost ink receptive layer, which thermally inert inorganic particles have an average particle size of at least 0.5 nm and up to and including 500 nm, and optionally, an innermost ink receptive layer that is disposed between the grained and anodized aluminum-containing substrate and the outermost ink receptive layer, the innermost ink receptive layer comprising at least one water-insoluble, alkali solution-soluble or -dispersible innermost resin that is different from the water-insoluble, alkali solution-soluble or -dispersible outermost resin, the positive-working lithographic printing plate precursor further comprising an infrared radiation absorber, wherein the silicate-free developer composition has a pH of at least 12.5, and comprises:

an alkali metal hydroxide present in an amount sufficient to provide the pH of at least 12.5;

a coating protecting agent present in an amount of at least 0.03 weight % and up to and including 0.5 weight %, based on the total weight of the silicate-free developer composition, and a moderator for the coating protecting agent in an amount of at least 0.5 weight % and up to and including 3 weight %, based on the total weight of the silicate-free developer composition, which moderator is represented by the following general formula (I):

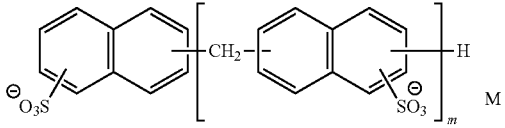

(I)

wherein m is at an integer of at least 1 and up to and including 10, and M represents one or more counterions sufficient to balance the negatively-charged sulfonate groups, wherein the coating protecting agent is a quaternary ammonium salt or a phosphonium salt represented by the following formulae (Q) and (P), respectively, or a mixture thereof:

$N(R_1R_2R_3R_4)^+X^-$     (Q)

wherein $R_1$, $R_2$, $R_3$, and $R_4$ are independently hydrocarbon groups connected directly to the nitrogen atom, each hydrocarbon group comprising sufficient carbon atoms so that the total number of carbon atoms for the four $R_1$, $R_2$, $R_3$, and $R_4$ hydrocarbon groups is at least 15 and up to and including 30, the maximum number of carbon atoms in each one of $R_1$, $R_2$, $R_3$, and $R_4$ is at least 5 and up to and including 22, and optionally, two or more of the $R_1$, $R_2$, $R_3$, and $R_4$ hydrocarbon groups can be connected to each other to form one or more heterocyclic ring structures with the illustrated nitrogen atom;

$P(R_5R_6R_7R_8)^+X^-$     (P)

wherein $R_5$, $R_6$, $R_7$, and $R_8$ are independently hydrocarbon groups connected directly to the phosphorus atom, each hydrocarbon group comprising sufficient carbon atoms so that the total number of carbon atoms for the four $R_5$, $R_6$, $R_7$, and $R_8$ hydrocarbon groups is at least 15 and up to and including 30, the maximum number of carbon atoms in each one of $R_5$, $R_6$, $R_7$, and $R_8$ is at least 5 and up to and including 22, and optionally, two or more of the $R_5$, $R_6$, $R_7$, and $R_8$ hydrocarbon groups can be connected to each other to form one or more heterocyclic ring structures with the illustrated phosphorus atom; and $X^-$ is an anion.

2. The method of claim 1, wherein the water-insoluble, alkali solution-soluble or -dispersible outermost resin comprises recurring units having an acetal structure.

3. The method of claim 1, wherein the positive-working lithographic printing plate precursor further comprises the innermost ink receptive layer that comprises a water-insoluble, alkali solution-soluble or -dispersible innermost resin that is a polymer comprising recurring units derived from one or more of a styrene, an alkyl (meth)acrylate, (meth)acrylic acid, (meth)acrylamide, (meth)acrylonitrile, N-phenyl maleimide, N-alkoxymethyl (meth)acrylamide, and 5-methacrylamido tetrazole.

4. The method of claim 1, wherein the infrared radiation absorber is present in at least the outermost ink receptive layer in an amount of at least 0.5 weight %, based on the total dry weight of the precursor minus the weight of the substrate.

5. The method of claim 1, wherein the positive-working lithographic printing plate precursor further comprises:

a poly(vinyl phosphonic acid) interlayer that optionally comprises phosphoric acid or a salt thereof comprising aluminum cations, which poly(vinyl phosphonic acid) interlayer is disposed directly on the grained and anodized aluminum-containing substrate.

6. The method of claim 1, further comprising baking the lithographic printing plate after processing the exposed precursor.

7. The method of claim 1, wherein the silicate-free developer composition further comprises $M^{+2}$ metal cations that are barium, calcium, strontium, or zinc cations, or a combination thereof, in an amount of at least 0.001 gram-atom/kg, and a chelating agent that has a complex formation constant (log K) for the $M^{+2}$ metal cation of at least 3.5 and less than or equal to 4.5, and a complex formation constant (log K) for aluminum ion of 7 or less, which chelating agent is present in an amount of at least 0.03 mol/liter.

8. The method of claim 1, wherein at least one of the $R_1$, $R_2$, $R_3$, and $R_4$ hydrocarbon groups, or at least one of the $R_5$, $R_6$, $R_7$ and $R_8$ hydrocarbon groups is an alkyl group.

9. The method of claim 1, wherein none of the $R_5$, $R_6$, $R_7$ and $R_8$ hydrocarbon groups is an aryl group with its aromatic ring connected directly to the phosphorus atom shown in formula (P).

10. The method of claim 1, wherein the silicate-free developer composition further comprises a $M^{+2}$ metal cation is a barium, calcium, strontium, or zinc cation, or combination thereof, in an amount of at least 0.0001 gram-atom/kg.

11. The method of claim 10, wherein the silicate-free developer composition further comprises a chelating agent that has a complex formation constant (log K) for the $M^{+2}$ metal cation of at least 3.5 and less than or equal to 4.5, and a complex formation constant (log K) for aluminum ion of 7 or less.

12. The method of claim 11, wherein the chelating agent is a phosphono-polycarboxylic acid that is present in the silicate-free developer composition in an amount of at least 0.001 mol/liter.

13. The method of claim 1, wherein the silicate-free developer composition further comprises an alkali metal salt in an amount of at least 0.001 mol/liter.

14. The method of claim 1, wherein m is an integer of at least 1 and up to and including 3.

* * * * *